(12) United States Patent
Urakami et al.

(10) Patent No.: US 9,902,810 B2
(45) Date of Patent: Feb. 27, 2018

(54) POLYAMIC ACID, VARNISH COMPRISING SAME AND POLYIMIDE FILM

(71) Applicant: MITSUI CHEMICALS, INC., Minato-ku, Tokyo (JP)

(72) Inventors: Tatsuhiro Urakami, Chiba (JP); Masaki Okazaki, Chiba (JP); Kenichi Fukukawa, Tokyo (JP); Yoshihiro Sakata, Ichikawa (JP); Atsushi Okubo, Tokyo (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 0 days.

(21) Appl. No.: 14/781,927

(22) PCT Filed: Apr. 1, 2014

(86) PCT No.: PCT/JP2014/001912
§ 371 (c)(1),
(2) Date: Oct. 2, 2015

(87) PCT Pub. No.: WO2014/162734
PCT Pub. Date: Oct. 9, 2014

(65) Prior Publication Data
US 2016/0032055 A1 Feb. 4, 2016

(30) Foreign Application Priority Data
Apr. 3, 2013 (JP) ................... 2013-077700

(51) Int. Cl.
*C08G 73/10* (2006.01)
*C08J 5/18* (2006.01)
(Continued)

(52) U.S. Cl.
CPC ............ *C08G 73/1067* (2013.01); *B32B 3/08* (2013.01); *B32B 27/281* (2013.01);
(Continued)

(58) Field of Classification Search
None
See application file for complete search history.

(56) References Cited

U.S. PATENT DOCUMENTS

| 5,061,809 A | 10/1991 | Angus, Jr. et al. |
| 5,759,442 A | 6/1998 | Auman et al. |
| (Continued) | | |

FOREIGN PATENT DOCUMENTS

| JP | 05031341 A | * | 2/1993 |
| JP | 2012-040836 A | | 3/2012 |
| TW | 293832 B | | 12/1996 |

OTHER PUBLICATIONS

International Search Report (PCT/ISA/210) dated Jun. 24, 2014, by the Japanese Patent Office as the International Searching Authority for International Application No. PCT/JP2014/001912.
Masatoshi Hasegawa et al., "Low-CTE Polyimides Derived From 2,3,6,7-Naphthalenetetracarboxylic Dianhydride", Polymer Journal, 2007, vol. 39, No. 6, pp. 610-621.
(Continued)

*Primary Examiner* — Rachel Kahn
(74) *Attorney, Agent, or Firm* — Buchanan, Ingersoll & Rooney PC

(57) ABSTRACT

The present invention addresses the problem of providing: a polyimide film that has a small phase difference in the thickness direction and has a low coefficient of linear thermal expansion; and a polyamic acid and varnish to obtain the same. In order to solve this problem, the present invention provides a polyimide film which comprises polyimide that is produced by reacting a diamine component and a tetracarboxylic dianhydride component, the polyimide film having a coefficient of linear thermal expansion of 35 ppm/K or less over a temperature range of 100 to 200 DEG C, an absolute value of phase difference in the thickness direction of 200 nm or less per 10 μm thickness, a glass transition temperature of 260 DEG C or more, and a total light transmittance of 85% or more.

32 Claims, 1 Drawing Sheet

(51) Int. Cl.
*B32B 27/28* (2006.01)
*B32B 3/08* (2006.01)
*C08G 73/12* (2006.01)
*H01L 27/32* (2006.01)
*H01L 51/00* (2006.01)

(52) U.S. Cl.
CPC ....... *C08G 73/1071* (2013.01); *C08G 73/126* (2013.01); *C08J 5/18* (2013.01); *H01L 27/323* (2013.01); *H01L 51/0035* (2013.01); *H01L 51/0096* (2013.01); *B32B 2457/20* (2013.01)

(56) References Cited

U.S. PATENT DOCUMENTS

| | | | |
|---|---|---|---|
| 2009/0088551 A1* | 4/2009 | Yamashita | C08G 73/10 528/353 |
| 2010/0304160 A1* | 12/2010 | Fukukawa | C08G 73/1007 428/458 |
| 2011/0318588 A1* | 12/2011 | Fukukawa | B32B 15/08 428/458 |

OTHER PUBLICATIONS

Hiroaki Mori et al., "2,3,6,7- Naphthalenetetracarboxylic Acid Dianhydride as a Monomer for Polyimide", JFE Glho, 2005, No. 8, pp. 49-56.

Muhammad Khalil et al., "Polyimide Molecular Composites Containing a Stiff-Chain Polymer Derived From 1,5-Diaminonaphathalene and Pyromellitic Dianhydride", Polymer Composites, 2010, pp. 645-652.

* cited by examiner

POLYAMIC ACID, VARNISH COMPRISING SAME AND POLYIMIDE FILM

TECHNICAL FIELD

The present invention relates to a polyamic acid and a varnish including the same, and a polyimide film.

BACKGROUND ART

Inorganic glass, a transparent material, has heretofore been used for panel substrates and the like in displays such as liquid crystal display devices and organic EL display devices. However, inorganic glass has higher specific gravity (heavier), as well as lower flexibility and impact resistance. In this situation, use of a polyimide film which is lightweight and excellent in impact resistance, workability and flexibility for a panel substrate of a display apparatus has been taken into consideration. For example, use of a polyimide film obtained by reacting bis(trifluoromethyl)benzidine with a tetracarboxylic dianhydride component for a substrate for a display apparatus has been proposed (PTL 1).

The panel substrate for a display apparatus requires high light transmittance. In a display apparatus, an image displayed by a device is observed through the panel substrate. Accordingly, the panel substrate also requires a small retardation in the traveling direction of light (thickness direction of the substrate). In addition, in a process for forming a device on a panel substrate, heat may be applied to the panel substrate. Therefore, the panel substrate also requires high heat resistance and high dimensional stability (coefficient of linear thermal expansion being small).

CITATION LIST

Patent Literature

PTL 1
Japanese Patent Application Laid-Open No. 2012-40836

SUMMARY OF INVENTION

Technical Problem

In general, the retardation in the thickness direction (Rth) and coefficient of linear thermal expansion (CTE) of a film are in a trade-off relationship. Therefore, it has been difficult for conventional polyimide films to have a low retardation in the thickness direction (Rth) while having a low coefficient of linear thermal expansion (CTE).

The present invention has been achieved in view of such circumstances, and the object of the invention is providing a polyimide film having a small retardation in the thickness direction and having a low coefficient of linear thermal expansion, and a polyamic acid and a varnish for obtaining the same. Another object of the present invention is to provide a display apparatus, such as a touch panel, having a device formed on the polyimide film.

Solution to Problem

A first aspect of the present invention relates to polyimide films as set forth below:
[1] A polyimide film made of a polyimide obtained by reacting a diamine component with a tetracarboxylic dianhydride component, wherein a coefficient of linear thermal expansion is 35 ppm/K or less throughout the range from 100° C. to 200° C., an absolute value of retardation in a thickness direction is 200 nm or less per thickness of 10 μm, a glass transition temperature is 260° C. or higher, and a total light transmittance is 85% or more.

[2] The polyimide film according to [1], wherein the diamine component includes 0 to 80 mol % of 1,5-diamino naphthalene represented by the following chemical formula (1), and the tetracarboxylic dianhydride component includes 0 to 100 mol % of naphthalene 2,3,6,7-tetracarboxylic dianhydride represented by the following chemical formula (2A) and/or naphthalene 1,2,5,6-tetracarboxylic dianhydride represented by the following chemical formula (2B) (with the proviso that 1,5-diamino naphthalene, naphthalene-2,3,6,7-tetracarboxylic dianhydride, and naphthalene-1,2,5,6-tetracarboxylic dianhydride are simultaneously not 0 mol %).

(1)

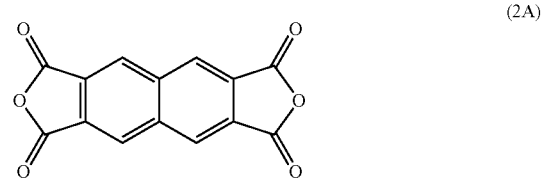
(2A)

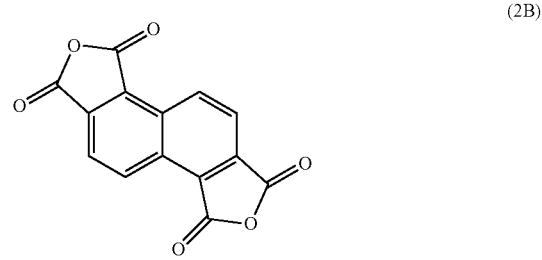
(2B)

[3] The polyimide film according to [2], wherein the diamine component includes 0 to 50 mol % of 9,9-bis(4-aminophenyl)fluorene represented by the following chemical formula (3), and the tetracarboxylic dianhydride component includes 0 to 50 mol % of fluorenylidene bis(phthalic anhydride) represented by the following chemical formula (4) (with the proviso that 9,9-bis(4-aminophenyl)fluorene and fluorenylidene bis(phthalic anhydride) are simultaneously not 0 mol %).

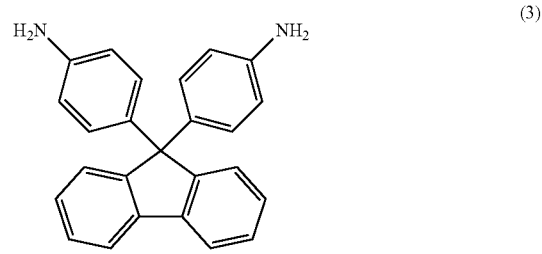
(3)

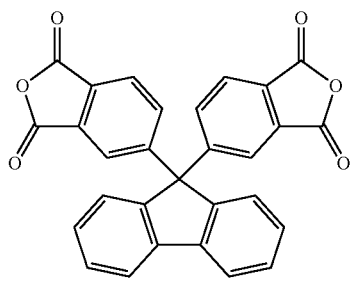

(4)

[4] The polyimide film according to [2] or [3], wherein the diamine component includes one or more compounds selected from the group consisting of 1,4-bis(aminomethyl)cyclohexane, bis(aminomethyl)norbornane, isophoronediamine, trans-1,4-diaminocyclohexane, and a hydrogenated product of 4,4'-diaminodiphenylmethane.

A second aspect of the present invention relates to polyamic acids and varnishes including the same, and polyimides, as set forth below:

[5] A polyamic acid obtained by reacting a diamine component with a tetracarboxylic dianhydride component, wherein a coefficient of linear thermal expansion of a polyimide film obtained by imidizing the polyamic acid is 35 ppm/K or less throughout the range from 100° C. to 200° C., an absolute value of retardation in a thickness direction of the polyimide film is 200 nm or less per thickness of 10 μm, a glass transition temperature of the polyimide film is 260° C. or higher, and a total light transmittance is 85% or more.

[6] A polyamic acid obtained by reacting a diamine component with a tetracarboxylic dianhydride component, wherein the diamine component includes 0 to 80 mol % of 1,5-diamino naphthalene represented by the following chemical formula (1), and the tetracarboxylic dianhydride component includes 0 to 100 mol % of naphthalene 2,3,6,7-tetracarboxylic dianhydride represented by the following chemical formula (2A) and/or naphthalene 1,2,5,6-tetracarboxylic dianhydride represented by the following chemical formula (2B) (with the proviso that 1,5-diamino naphthalene, naphthalene 2,3,6,7-tetracarboxylic dianhydride, and naphthalene 1,2,5,6-tetracarboxylic dianhydride are simultaneously not 0 mol %).

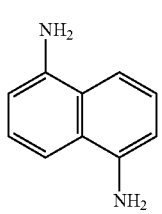

(1)

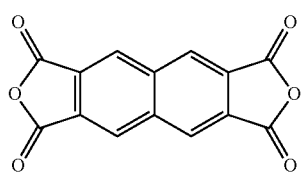

(2A)

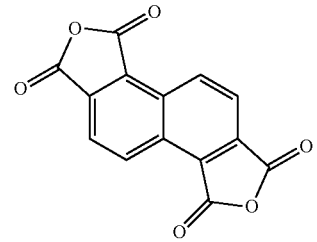

(2B)

[7] The polyamic acid according to [6], wherein the diamine component includes 0 to 50 mol % of 9,9-bis(4-aminophenyl)fluorene represented by the following chemical formula (3), and the tetracarboxylic dianhydride component includes 0 to 50 mol % of fluorenylidene bis(phthalic anhydride) represented by the following chemical formula (4) (with the proviso that 9,9-bis(4-aminophenyl)fluorene and fluorenylidene bis(phthalic anhydride) are simultaneously not 0 mol %).

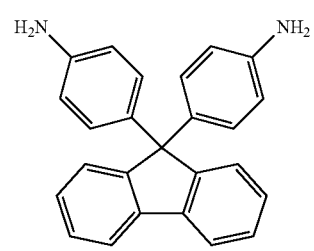

(3)

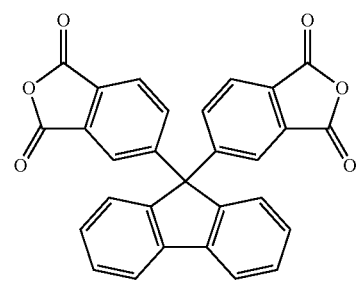

(4)

[8] The polyamic acid according to [6] or [7], wherein the diamine component includes one or more compounds selected from the group consisting of 1,4-bis(aminomethyl)cyclohexane, bis(aminomethyl)norbornane, isophoronediamine, trans-1,4-diaminocyclohexane, and a hydrogenated product of 4,4'-diaminodiphenylmethane.

[9] A polyamic acid varnish including the polyamic acid according to any of [5] to [8].

[10] A dry film including the polyamic acid according to any of [5] to [8].

[11] A polyimide obtained by curing the polyamic acid according to any of [6] to [8].

A third aspect of the present invention relates to methods of manufacturing a polyimide laminate and a display apparatus, and various display apparatuses, as set forth below:

[12] A method of manufacturing a polyimide laminate in which a substrate and a polyimide layer are laminated, the method including: coating a substrate with the polyamic acid varnish according to [9]; and heating a film of the coated polyamic acid varnish in an inert gas atmosphere.

[13] A method of manufacturing a polyimide laminate in which a substrate and a polyimide layer are laminated, the method including: coating a substrate with the polyamic acid varnish according to [9]; and heating a film of the coated polyamic acid under an atmosphere of 15 kPa or less.

[14] A polyimide film obtained by peeling off the substrate from the polyimide laminate obtained by the manufacturing method of [12] or [13].

[15] A method of manufacturing a display apparatus, the method including: peeling off the substrate from the polyimide laminate obtained by the manufacturing method of [12] or [13], thereby obtaining a polyimide film; and forming a device on the polyimide film.

[16] A method of manufacturing a display apparatus, the method including: forming a device on the polyimide layer of the polyimide laminate obtained by the manufacturing method of [12] or [13]; and peeling off the polyimide layer on which the device is formed from the substrate.

[17] A touch panel display obtained by the method of manufacturing the display apparatus according to [15] or [16].

[18] A liquid crystal display obtained by the method of manufacturing the display apparatus according to [15] or [16].

[19] An organic EL display obtained by the method of manufacturing the display apparatus according to [15] or [16].

[20] A touch panel display including the polyimide film according to any of [1] to [4].

[21] A liquid crystal display including the polyimide film according to any of [1] to [4].

[22] An organic EL display including the polyimide film according to any of [1] to [4].

Advantageous Effects of Invention

The polyimide film of the present invention has small retardation in the thickness direction, small coefficient of linear thermal expansion, and high transmittance of visible light. Accordingly, the polyimide film of the present invention is applicable to a panel substrate for various display apparatuses.

DESCRIPTION OF EMBODIMENTS

Figure 1A:
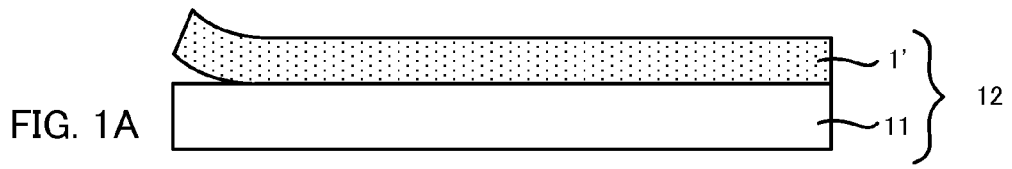
FIGS. 1A and 1B are schematic sectional views illustrating an example of a method of manufacturing a display apparatus using a polyimide laminate of the present invention.

1. Polyimide Film (1) Physical Properties of Polyimide Film

The present invention relates to a polyimide film applicable to a panel substrate of various display apparatuses. The coefficient of linear thermal expansion of the polyimide film of the present invention is 35 ppm/K or less, preferably 30 ppm/K or less, and more preferably 25 ppm/K or less throughout the range from 100° C. to 200° C. When the coefficient of linear thermal expansion at the above-mentioned temperature is low, the polyimide film is difficult to deform even at elevated temperatures. Accordingly, various devices can be laminated on the polyimide film. The coefficient of linear thermal expansion of the polyimide film is adjusted by the type of the diamine component or the tetracarboxylic dianhydride component constituting the polyimide, as described below. The above-mentioned coefficient of linear thermal expansion is measured by a thermomechanical analyzer (TMA).

In addition, the absolute value of the retardation in the thickness direction of the polyimide film of the present invention is 200 nm or less, preferably 160 nm or less, and more preferably 120 nm or less per thickness of 10 μm. When the retardation in the thickness direction is 200 nm or less, distortion of an image observed through the polyimide film is less likely to occur. Accordingly, the polyimide film of the present invention is suitable for an optical film. The retardation in the thickness direction of the polyimide film is adjusted by the type of the diamine component or the tetracarboxylic dianhydride component constituting the polyimide, as described below.

The above-mentioned absolute value of the retardation in the thickness direction is calculated as follows. An optical material inspection apparatus (model: RETS-100) manufactured by Otsuka Electronics Co., Ltd. is used to measure a refractive index of the polyimide film in the x-axis direction ($nx$), a refractive index thereof in the y-axis direction ($ny$), and a refractive index thereof in the z-axis direction ($nz$) at room temperature (20° C. to 25° C.) using light with a wavelength of 550 nm. The absolute value of the retardation in the thickness direction of the film is calculated based on these measurements and thickness (d) of the film.

$$\text{Absolute value of retardation in thickness direction of film (nm)} = |[nz - (nx+ny)/2] \times d|$$

The calculated value is converted into a value per film thickness of 10 μm.

Further, the polyimide film of the present invention has a total light transmittance of 85% or more, preferably 88% or more, and more preferably 90% or more. A polyimide film having such a high total light transmittance is suitable for an optical film. The light transmittance of the polyimide film is adjusted by the amount of units (imide groups) in the polyimide which are bound to the aromatic diamines and the aromatic tetracarboxylic dianhydrides, and by the conditions for imidizing the polyamic acid during the manufacture of the polyimide. The total light transmittance of the polyimide film is measured with the D65 light source in accordance with JIS-K7105.

On the other hand, the polyimide film of the present invention has a glass transition temperature (Tg) of 260° C. or higher, preferably 280° C. or higher, and more preferably 310° C. or higher. When the polyimide film has a glass transition temperature of 260° C. or higher, the polyimide film can be used in applications where high heat resistance is required. The above-mentioned glass transition temperature is measured by a thermomechanical analyzer (TMA). The glass transition temperature of the polyimide film is adjusted according to, for example, the equivalent of an imide group contained in the polyimide, or the structure of a diamine component or a tetracarboxylic dianhydride component constituting the polyimide.

The thickness of the polyimide film of the present invention is not particularly limited, and is appropriately selected, for example, depending on the applications of the polyimide film. The thickness of the polyimide film is typically 1 to 50 μm, preferably 5 to 50 μm, and more preferably 5 to 30 μm.

(2) Composition of Polyimide

The polyimide constituting the polyimide film of the present invention is obtained by reacting a diamine component with a tetracarboxylic dianhydride component. As described above, in order to reduce the retardation in the thickness of the polyimide film while reducing the coefficient of linear thermal expansion of the film, it is preferable to include, in the diamine component and the tetracarboxylic dianhydride component, the following component (i), and it is more preferable to include the following components (ii) and (iii) together with the component (i).

Component (i): a specific diamine or tetracarboxylic dianhydride containing a naphthalene structure Component (ii): a specific diamine or tetracarboxylic dianhydride containing a 9,9-diphenylfluorene structure Component (iii): a specific alicyclic diamine compound Component (i)

The specific diamine or tetracarboxylic dianhydride containing a naphthalene structure may be 1,5-diaminonaphthalene represented by the following formula (1), naphthalene 2,3,6,7-tetracarboxylic dianhydride represented by the following formula (2A), or naphthalene 1,2,5,6-tetracarboxylic dianhydride represented by the following formula (2B). The component constituting the polyimide may include either only one of the compounds or two or more of the compounds mentioned above.

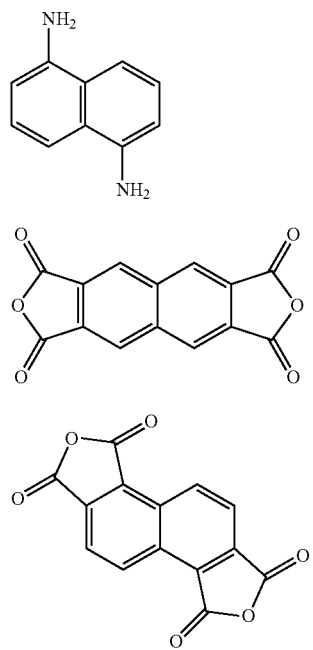

When the polyimide contains the naphthalene structure derived from the above-mentioned component (i) in the structure thereof, the coefficient of linear thermal expansion of the polyimide film becomes reduced without increasing the retardation in the thickness direction of the film. The ratio of the total amount (mol) of the component (i) to the total amount (mol) of the diamine component and the tetracarboxylic dianhydride component is preferably 2.5 to 60 mol %, more preferably 5 to 50 mol %, and even more preferably 5 to 40 mol %.

However, when 1,5-diaminonaphthalene is contained excessively in the diamine component, the polyimide film may become colored. Accordingly, 1,5-diaminonaphthalene is preferably contained together with other diamine components (e.g., component (iii) described below). The amount of 1,5-diaminonaphthalene contained in the diamine component is preferably 80 mol % or less, more preferably 5 to 60 mol %, and even more preferably 5 to 40 mol %.

On the other hand, even when naphthalene 2,3,6,7-tetracarboxylic dianhydride or naphthalene 1,2,5,6-tetracarboxylic dianhydride is contained in a large amount, the polyimide film is not easily colored when a diamine component combined therewith is an alicyclic diamine (such as component (iii) described below). Accordingly, all of the tetracarboxylic dianhydride components may be naphthalene 2,3,6,7-tetracarboxylic dianhydride and/or naphthalene 1,2,5,6-tetracarboxylic dianhydride. The total amount of naphthalene 2,3,6,7-tetracarboxylic dianhydride and naphthalene 1,2,5,6-tetracarboxylic dianhydride contained in the tetracarboxylic dianhydride component is preferably 5 to 100 mol %, more preferably 10 to 80 mol %, and even more preferably 10 to 60 mol %.

Component (ii)

The specific diamine or tetracarboxylic dianhydride containing a 9,9-diphenylfluorene structure may be 9,9-bis(4-aminophenyl)fluorene represented by the following formula (3), or fluorenylidene bis(phthalic anhydride) represented by the following formula (4). The component constituting the polyimide may include either only one of the compounds or both of the compounds mentioned above.

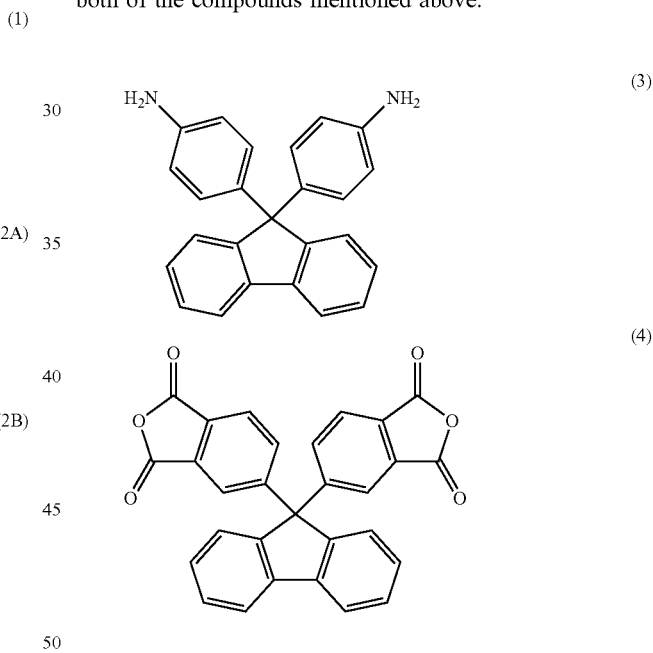

When the polyimide contains the 9,9-diphenylfluorene structure derived from the above-mentioned component (ii) in the structure thereof, the retardation in the thickness direction of the polyimide film becomes reduced without increasing the coefficient of linear thermal expansion of the polyimide film. On the other hand, when the polyimide contains excessive amount of the fluorene structure in the structure thereof, it becomes difficult to increase the inherent logarithmic viscosity (ηinh), an index for the molecular weight of a polyamic acid used for obtaining the polyimide. Further, the mechanical strength of the polyimide film tends to be lowered, causing the film to be easily embrittled. Accordingly, the ratio of the total amount (mol) of the component (ii) to the total amount (mol) of the diamine component and the tetracarboxylic dianhydride component is preferably 5 to 50 mol %, more preferably 5 to 40 mol %, and even more preferably 10 to 30 mol %.

In addition, from the viewpoint of reducing the amount of the fluorene structure contained in the structure of the polyimide, 9,9-bis(4-aminophenyl)fluorene is preferably contained together with other diamine components. The amount of 9,9-bis(4-aminophenyl)fluorene contained in the diamine component is preferably 50 mol % or less, more preferably 5 to 40 mol %, and even more preferably 5 to 30 mol %.

Further, from the viewpoint of reducing the amount of the fluorene structure contained in the structure of the polyimide, fluorenylidene bis(phthalic anhydride) is also preferably combined with other tetracarboxylic dianhydrides. The amount of fluorenylidene bis(phthalic anhydride) contained in the tetracarboxylic dianhydride component is preferably 50 mol % or less, more preferably 5 to 40 mol %, and even more preferably 5 to 30 mol %.

Component (iii)

The specific alicyclic diamine compound may be a compound selected from the group consisting of 1,4-bis(aminomethyl)cyclohexane, bis(aminomethyl)norbornane, isophoronediamine, trans-1,4-diaminocyclohexane, and a hydrogenated product of 4,4'-diaminophenylmethane. The diamine component constituting the polyimide may include either only one of the compounds or two or more of the compounds.

Among the compounds selected from the above-mentioned group, a compound selected from the group consisting of 1,4-bis(aminomethyl)cyclohexane, bis(aminomethyl) norbornane, and trans-1,4-diaminocyclohexane is preferred from the viewpoint of reducing both the retardation in the thickness direction and the coefficient of linear thermal expansion of the polyimide film.

When the polyimide contains the alicyclic structure derived from the above-mentioned component (iii) is in the structure thereof, the retardation in the thickness direction of the polyimide film becomes reduced without increasing the coefficient of linear thermal expansion of the polyimide film. In addition, the total light transmittance of the polyimide film becomes increased. The total amount (mol) of the component (iii) based on the total amount (mol) of the diamine component is preferably 10 to 90 mol %, and more preferably 20 to 80 mol %.

Other Additives

The components constituting the polyimide may include diamines, tetracarboxylic dianhydrides, acid trianhydrides, acid tetraanhydrides, or the like which are exclusive of the above-mentioned components (i) to (iii).

Examples of other diamines include a compound represented by the following general formula (5):

(5)

wherein R' is a divalent group having 4 to 51 carbon atoms, and R' may be an aliphatic group; a monocyclic aliphatic group (excluding an isophoronylene group, a residue of a hydrogenated product of 4,4'-diaminophenylmethane, a group represented by the following general formula (X), a group represented by the following general formula (Y), and a group represented by the following general formula (Z)); a condensed polycyclic aliphatic group; a monocyclic aromatic group; a condensed polycyclic aromatic group (excluding naphthalene); a non-condensed polycyclic aliphatic group in which cyclic aliphatic groups are mutually linked to each other either directly or via a crosslinking member; or a non-condensed polycyclic aromatic group in which aromatic groups are mutually linked to each other either directly or via a crosslinking member (excluding 9,9-diphenylfluorene).

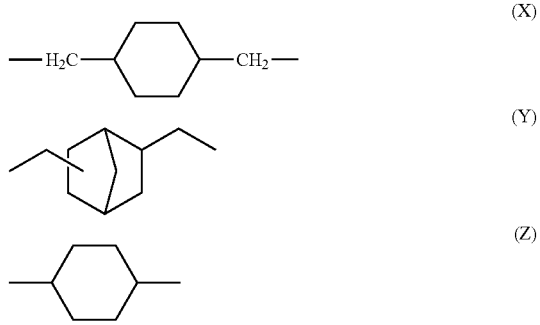

Examples of diamines represented by the above general formula (5) include a diamine having a benzene ring, a diamine having an aromatic substituent, a diamine having a spirobiindan ring, siloxane diamines, ethylene glycol diamines, alkylenediamines, and alicyclic diamines.

Examples of the diamine having a benzene ring include:

<1> diamines having one benzene ring, such as p-phenylenediamine, m-phenylenediamine, p-xylylenediamine, and m-xylylenediamine;

<2> diamines having two benzene rings, such as 3,3'-diaminodiphenylether, 3,4'-diaminodiphenylether, 4,4'-diaminodiphenylether, 3,3'-diaminodiphenylsulfide, 3,4'-diaminodiphenylsulfide, 4,4'-diaminodiphenylsulfide, 3,3'-diaminodiphenylsulfone, 3,4'-diaminodiphenylsulfone, 4,4'-diaminodiphenylsulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, and 4,4'diamino-2,2'-bistrifluoromethylbiphenyl;

<3> diamines having three benzene rings, such as 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl) benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy) benzonitrile, and 2,6-bis(3-aminophenoxy)pyridine;

<4> diamines having four benzene rings, such as 4,4'-bis (3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy) phenyl]sulfide, bis[4-(4-aminophenoxy)phenyl]sulfide, bis [4-(3-aminophenoxy)phenyl]sulfone, bis[4-(4-aminophenoxy)phenyl]sulfone, bis[4-(3-aminophenoxy) phenyl]ether, bis[4-(4-aminophenoxy)phenyl]ether, 2,2-bis [4-(3-aminophenoxy)phenyl]propane, 2,2-bis[4-(4-aminophenoxy)phenyl]propane, 2,2-bis[3-(3- aminophenoxy)phenyl]-1,1,1,3,3,3-hexafluoropropane, and 2,2-bis[4-(4-aminophenoxy)phenyl]-1,1,1,3,3,3-hexafluoropropane;

<5> diamines having five benzene rings, such as 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, and 1,4-bis[4-(4-aminophenoxy)-α,α-dimethylbenzyl]benzene; and <6> diamines having six benzene rings, such as 4,4'-bis[4-(4-aminophenoxy)benzoyl]diphenylether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, and 4,4'-bis[4-(4-aminophenoxy)phenoxy]diphenylsulfone.

Examples of the diamine having an aromatic substituent include 3,3'-diamino-4,4'-diphenoxybenzophenone, 3,3'-diamino-4,4'-dibiphenoxybenzophenone, 3,3'-diamino-4-phenoxybenzophenone, and 3,3'-diamino-4-biphenoxybenzophenone.

Examples of the diamine having a spirobiindan ring include 6,6'-bis(3-aminophenoxy)-3,3,3',3'-tetramethyl-1,1'-spirobiindan, and 6,6'-bis(4-aminophenoxy)-3,3,3',3'-tetramethyl-1,1'-spirobiindan.

Examples of the siloxane diamines include 1,3-bis(3-aminopropyl)tetramethyldisiloxane, 1,3-bis(4-aminobutyl)tetramethyldisiloxane, α,ω-bis(3-aminopropyl)polydimethylsiloxane, and α,ω-bis(3-aminobutyl)polydimethylsiloxane.

Examples of the ethylene glycol diamines include bis(aminomethyl)ether, bis(2-aminoethyl)ether, bis(3-aminopropyl)ether, bis[(2-aminomethoxy)ethyl]ether, bis[2-(2-aminoethoxy)ethyl]ether, bis[2-(3-aminoprotoxy)ethyl]ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethylene glycol bis(3-aminopropyl)ether, diethylene glycol bis(3-aminopropyl)ether, and triethylene glycol bis(3-aminopropyl)ether.

Examples of the alkylenediamines include ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane.

Examples of the alicyclic diamines include 1,2-diaminocyclohexane, 1,3-diaminocyclohexane, cyclobutanediamine, di(aminomethyl)cyclohexane [bis(aminomethyl)cyclohexane excluding 1,4-bis(aminomethyl)cyclohexane], diaminobicycloheptane, diaminomethylbicycloheptane (including norbornanediamines such as norbornanediamine), diaminooxybicycloheptane, diaminomethyloxybicycloheptane (including oxanorbornanediamine), diaminotricyclodecane, diaminomethyltricyclodecane, bis(aminocyclohexyl)methane [or methylenebis(cyclohexylamine)], and bis(aminocyclohexyl)isopropylidene.

Examples of other tetracarboxylic dianhydrides include a compound represented by the following general formula (6):

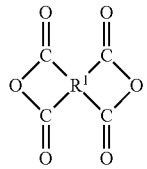

(6)

In the general formula (6), $R^1$ denotes a tetravalent organic group having 4 to 27 carbon atoms. $R^1$ may be an aliphatic group; a monocyclic aliphatic group; a condensed polycyclic aliphatic group; a monocyclic aromatic group; a condensed polycyclic aromatic group (excluding naphthalene in which carboxylic groups are bonded to positions 2, 3, 6, and 7); a non-condensed polycyclic aliphatic group in which cyclic aliphatic groups are mutually linked to each other either directly or via a crosslinking member; or a non-condensed polycyclic aromatic group in which aromatic groups are mutually linked to each other either directly or via a crosslinking member (excluding 9,9-diphenylfluorene).

It is preferable that the tetracarboxylic dianhydride represented by the general formula (6) is particularly an aromatic tetracarboxylic dianhydride or an alicyclic tetracarboxylic dianhydride.

Examples of the aromatic tetracarboxylic dianhydride represented by the general formula (6) include pyromellitic dianhydride, 3,3',4,4'-biphenyltetracarboxylic dianhydride, 3,3',4,4'-benzophenonetetracarboxylic dianhydride, bis(3,4-dicarboxyphenyl)ether dianhydride, bis(3,4-dicarboxyphenyl)sulfide dianhydride, bis(3,4-dicarboxyphenyl)sulfone dianhydride, bis(3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, 1,3-bis(3,4-dicarboxyphenoxy)benzene dianhydride, 1,4-bis(3,4-dicarboxyphenoxy)benzene dianhydride, 4,4'-bis(3,4-dicarboxyphenoxy)biphenyl dianhydride, 2,2-bis[(3,4-dicarboxyphenoxy)phenyl]propane dianhydride, 1,4,5,8-naphthalenetetracarboxylic dianhydride, 2,2',3,3'-benzophenonetetracarboxylic dianhydride, 2,2',3,3'-biphenyltetracarboxylic dianhydride, 2,2-bis(2,3-dicarboxyphenyl)propane dianhydride, 2,2-bis(2,3-dicarboxyphenyl)-1,1,1,3,3,3-hexafluoropropane dianhydride, bis(2,3-dicarboxyphenyl)ether dianhydride, bis(2,3-dicarboxyphenyl)sulfide dianhydride, bis(2,3-dicarboxyphenyl)sulfone dianhydride, 1,3-bis(2,3-dicarboxyphenoxy)benzene dianhydride, 1,4-bis(2,3-dicarboxyphenoxy)benzene dianhydride, 1,2,5,6-naphthalenetetracarboxylic dianhydride, 1,3-bis(3,4-dicarboxybenzoyl)benzene dianhydride, 1,4-bis(3,4-dicarboxybenzoyl)benzene dianhydride, 1,3-bis(2,3-dicarboxybenzoyl)benzene dianhydride, 1,4-bis(2,3-dicarboxybenzoyl)benzene dianhydride, 4,4'-isophthaloyldiphthalic anhydride, diazodiphenylmethane-3,3',4,4'-tetracarboxylic dianhydride, diazodiphenylmethane-2,2',3,3'-tetracarboxylic dianhydride, 2,3,6,7-thioxanthonetetracarboxylic dianhydride, 2,3,6,7-anthraquinonetetracarboxylic dianhydride, and 2,3,6,7-xanthonetetracarboxylic dianhydride.

Examples of the alicyclic tetracarboxylic dianhydride represented by the general formula (6) include cyclobutanetetracarboxylic dianhydride, 1,2,3,4-cyclopentanetetracarboxylic dianhydride, 1,2,4,5-cyclohexanetetracarboxylic dianhydride, bicyclo[2.2.1]heptane-2,3,5,6-tetracarboxylic dianhydride, bicyclo[2.2.2]octo-7-ene-2,3,5,6-tetracarboxylic dianhydride, bicyclo[2.2.2]octane-2,3,5,6-tetracarboxylic dianhydride, 2,3,5-tricarboxycyclopentylacetic dianhydride, bicyclo[2.2.1]heptane-2,3,5-tricarboxylic-6-acetic dianhydride, 1-methyl-3-ethylcyclohexa-1-ene-3-(1,2),5,6-tetracarboxylic dianhydride, decahydro-1,4,5,8-dimethanonapthalene-2,3,6,7-tetracarboxylic dianhydride, 4-(2,5-dioxotetrahydrofuran-3-yl)-tetralin-1,2-dicarboxylic dianhydride, and 3,3',4,4'-dicyclohexyltetracarboxylic dianhydride.

When the tetracarboxylic dianhydride represented by the general formula (6) includes an aromatic ring, such as a benzene ring, some or all of the hydrogen atoms in the aromatic ring may be substituted by a fluoro group, a methyl group, a methoxy group, a trifluoromethyl group, a trifluoromethoxy group, or the like. In addition, when the tetracarboxylic dianhydride represented by the general formula (6) contains an aromatic ring, such as a benzene ring, depending on its use, the tetracarboxylic dianhydride may further contain a group selected from an ethynyl group, a benzocyclobutene-4'-yl group, a vinyl group, an allyl group, a cyano group, an isocyanate group, a nitrilo group, an isopropenyl group, and the like which serves as a crosslinking site. In particular, the tetracarboxylic dianhydride represented by the general formula (6) preferably contains a group which serves as a crosslinking site, such as a vinylene group, a vinylidene group or an ethynylidene group, in the main chain skeleton thereof. The amount of such a group is in a range which do not impair the moldability of the tetracarboxylic dianhydride.

An example of the acid trianhydride is a hexacarboxylic trianhydride, and an example of the acid tetraanhydride is an octacarboxylic tetraanhydride.

(3) Preferable Compositions of Diamine Component and Tetracarboxylic Dianhydride Component As described above, it is preferred that either one or both of the diamine component and the tetracarboxylic dianhydride component constituting the polyimide contain component (i). In addition, from the viewpoint of reducing the retardation in the thickness direction of the polyimide film, it is preferred that the diamine component and the tetracarboxylic dianhydride component constituting the polyimide contains either one or both of the components (ii) and (iii). Specifically, the total amount (mol) of the components (ii) and (iii), relative to the total amount (mol) of the diamine component and the tetracarboxylic dianhydride component, is preferably 20 to 90 mol %, and more preferably 20 to 70 mol %.

In addition, the polyimide may be either a random polymer or a block copolymer. However, when the polyimide contains a large amount of a unit (imide group) in which an aromatic diamine and an aromatic tetracarboxylic dianhydride are polymerized, the polyimide film is likely to become colored, and the total light transmittance becomes lowered. Accordingly, when the polyimide is a random polymer, it is preferred that the total amount (mol) of the aromatic diamine and the aromatic tetracarboxylic dianhydride, relative to the total amount (mol) of the diamine component and the tetracarboxylic dianhydride component, is small. Specifically, the amount is preferably 20 to 70 mol %, more preferably 35 to 65 mol %, and even more preferably 50 to 60 mol %.

On the other hand, the polyimide may be a block copolymer which is obtained by: polymerizing a specific diamine component and a specific tetracarboxylic dianhydride component to obtain a polyamic acid oligomer; polymerizing a specific diamine component and a specific tetracarboxylic dianhydride component to obtain a polyimide oligomer; reacting the thus obtained polyamic acid oligomer and polyimide oligomer to obtain a poly(amic acid imide); and imidizing the obtained polyamic acid imide. Accordingly, it is preferred that the diamine components and the tetracarboxylic dianhydride components contained in each block are used in a combination which does not form a polymer block of the aromatic diamine and the aromatic tetracarboxylic dianhydride.

(4) Method of Manufacturing Polyimide Film

The polyimide film of the present invention is obtained by 1) preparing a polyamic acid by reacting the diamine component with the tetracarboxylic dianhydride component, 2) coating a substrate with a varnish containing the polyamic acid to form a coating film, and 3) imidizing (ring closure of) the polyamic acid constituting the coating film. When the polyimide is a block copolymer, the polyimide film is obtained by 1) preparing a block poly(amic acid imide) by reacting a polyamic acid oligomer with a polyimide oligomer, 2) coating a substrate with a varnish containing the block poly(amic acid imide) to form a coating film, and 3) imidizing (ring closure of) the block poly(amic acid imide) constituting the coating film.

(4-1) Preparation of Polyamic Acid

The diamine component and the tetracarboxylic dianhydride component to be used for the preparation of the polyamic acid may be the same as the above-mentioned components (i) to (iii) and other components. In addition, the amount of each component may also be within the ranges described above. On the other hand, the ratio (y/x) of the total molar amount of the diamine component (x) and the total molar amount of the tetracarboxylic dianhydride component (y) during the preparation of the polyamic acid is preferably 0.9 to 1.1, more preferably 0.95 to 1.05, even more preferably 0.97 to 1.03, and particularly preferably 0.99 to 1.01.

The method of polymerizing the diamine component and the tetracarboxylic dianhydride component to obtain a polyamic acid is not particularly limited, and may be a common method. For example, a vessel equipped with a stirrer and a nitrogen inlet is prepared, and the vessel is purged with nitrogen and charged with a solvent. The diamine component is then added such that a polyamic acid to be obtained has a solid content concentration of 50% by mass or less, followed by temperature adjustment and stirring for dissolution. The tetracarboxylic dianhydride component is added to the solution such that the ratio of the tetracarboxylic dianhydride to the diamine component is within the above-mentioned range. Then, stirring is carried out for 1 to 50 hours while adjusting the temperature.

The solvent for preparing the polyamic acid is not particularly limited insofar as the solvent is capable of dissolving the diamine component and the tetracarboxylic dianhydride component. For example, the solvent may be an aprotic polar solvent, or a water-soluble alcoholic solvent.

Examples of the aprotic polar solvent include: N-methyl-2-pyrrolidone, N,N-dimethylformamide, N,N-dimethylacetamide, dimethylsulfoxide, hexamethylphosphoramide, and 1,3-dimethyl-2-imidazolidinone; and ether compounds such as 2-methoxyethanol, 2-ethoxyethanol, 2-(methoxymethoxy)ethoxyethanol, 2-isopropoxyethanol, 2-butoxyethanol, tetrahydrofurfurylalcohol, diethylene glycol, diethylene glycol monomethyl ether, diethylene glycol monoethyl ether, diethylene glycol monobutyl ether, triethylene glycol, triethylene glycol monoethyl ether, tetraethylene glycol, 1-methoxy-2-propanol, 1-ethoxy-2-propanol, dipropylene glycol, dipropylene glycol monomethyl ether, dipropylene glycol monoethyl ether, tripropylene glycol monomethyl ether, polyethylene glycol, polypropylene glycol, tetrahydrofuran, dioxane, 1,2-dimethoxyethane, diethylene glycol dimethyl ether, and diethylene glycol diethyl ether.

Examples of the water-soluble alcohol solvent include methanol, ethanol, 1-propanol, 2-propanol, tert-butylalcohol, ethylene glycol, 1,2-propanediol, 1,3-propanediol, 1,3-butanediol, 1,4-butanediol, 2,3-butanediol, 1,5-pentanediol, 2-butene-1,4-diol, 2-methyl-2,4-pentanediol, 1,2,6-hexanetriol, and diacetonealcohol.

The solvent for preparing the polyamic acid may include either only one solvent or two or more solvents. The preferred solvent for preparing the polyamic acid includes N,N-dimethylacetamide, N-methyl-2-pyrrolidone, or a mixture thereof.

On the other hand, the block poly(amic acid imide) is obtained, for example, by adding a solution of an acid anhydride-terminated polyimide oligomer to a solution of an amine-terminated polyamic acid oligomer, followed by stirring to thereby produce a poly(amic acid imide). The polyimide oligomer containing an alicyclic structure may be difficult to dissolve into the solvent. Therefore, it is preferred to prepare a polyamic acid oligomer such that an alicyclic diamine (e.g., the above-mentioned component (iii)) is contained in the polyamic acid oligomer.

(4-2) Coating of Polyamic Acid Varnish

The surface of various substrates, or the like is coated with a varnish containing the above-mentioned polyamic acid to obtain a thin film shaped varnish. The varnish contains a solvent together with the polyamic acid. The solvent in the varnish may be the same or different from the solvent used for preparing the polyamic acid. The varnish may contain either only one solvent or two or more solvents.

The amount of the polyamic acid contained in the varnish is preferably 1 to 50% by mass, and more preferably 10 to 45% by mass. When the concentration of the polyamic acid exceeds 50% by mass, the viscosity of the varnish becomes excessively high, sometimes making it difficult to coat the substrate with the varnish. On the other hand, when the concentration of the polyamic acid is less than 1% by mass, the viscosity of the varnish becomes too low, sometimes making it impossible to coat the substrate in a desired thickness. In addition, it takes time to dry the solvent, thus, lowering the manufacturing efficiency of the polyimide film.

The substrate coated with the varnish is not particularly limited, insofar as the substrate has solvent resistance and heat resistance. The substrate preferably has excellent peeling-off property with respect to the polyimide layer obtained, and is preferably a glass, or a flexible substrate made of, for example, a metal or a heat-resistant polymer film. Examples of the flexible substrates made of metal include a metal foil made of copper, aluminum, stainless steel, iron, silver, palladium, nickel, chrome, molybdenum, tungsten, zirconium, gold, cobalt, titanium, tantalum, zinc, lead, tin, silicon, bismuth, indium, or an alloy thereof. The surface of the metal foil may be coated with a release agent.

Examples of the flexible substrate made of heat-resistant polymer film include a polyimide film, an aramid film, a polyetheretherketone film, and a polyetherethersulfone film. The flexible substrate made of a heat-resistant polymer film may either contain a release agent or an antistatic agent, or be coated with the release agent or the antistatic agent on its surface. The substrate is preferably a polyimide film, since it has excellent peeling-off property with respect to the obtained polyimide film and has higher heat resistance and solvent resistance.

The shape of the substrate is appropriately selected in accordance with the shape of a polyimide film to be manufactured, and may have either a single sheet shape or an elongated shape. The thickness of the substrate is preferably 5 to 150 μm, and more preferably 10 to 70 μm. When the thickness of the substrate is less than 5 μm, the substrate may become wrinkled or may be split during the coating of the substrate with the varnish.

The method of coating the substrate with the varnish is not particularly limited insofar as the method allows the varnish to be applied at a constant thickness. Examples of the applicator include die coater, comma coater, roll coater, gravure coater, curtain coater, spray coater, and lip coater. The thickness of the film (application thickness) of the coated polyamic acid is appropriately selected depending on the thickness of a polyimide film.

(4-3) Imidization of Polyamic Acid

Subsequently, the film of the coated varnish containing a polyamic acid is heated to imidize (ring closure of) the polyamic acid. Specifically, it is preferable that the film of the varnish containing the polyamic acid is heated while raising the temperature from 150° C. or less up to more than 200° C., and is further heated for a set period of time at a temperature (constant temperature) which is above a temperature necessary for satisfactorily removing a solvent inside the polyimide film to be obtained.

In general, the imidization temperature for a polyamic acid is 150° C. to 200° C. Therefore, when the temperature of the polyamic acid is increased drastically to 200° C. or more, the polyamic acid at the surface of the coating film becomes imidized before the solvent is volatilized from the coating film. Then, the solvent inside the coating film may cause bubbles, or the coating film surface may have irregularities formed by the release of the solvent to the outside. Accordingly, it is preferred to raise the temperature of the coating film gradually within the range of 150° C. to 200° C. Specifically, the rate of temperature rise within the temperature range of 150° C. to 200° C. is set at preferably 0.25 to 50° C./min., more preferably 1 to 40° C./min., and even more preferably 2 to 30° C./min.

The temperature rise may be either continuous or gradual (sequential), but is preferably continuous, from the viewpoint of suppressing the defective appearance of the polyimide film to be obtained. In addition, throughout the above-mentioned entire temperature range, the rate of temperature rise may be either constant or varied.

An example of a method for heating the single sheet-shaped coating film under the rising temperature condition is a method of raising the temperature inside an oven. In this case, the rate of temperature rise is adjusted by the setting of the oven. In addition, for heating the elongated coating film under the rising temperature conditions, there can be mentioned, for example, a method in which a plurality of heating furnaces for heating the coating film is disposed along a direction in which the substrate is conveyed (moved); and the temperatures of the respective heating furnaces are varied. For example, the temperature of each heating furnace is raised along the direction in which the substrate is being moved. In this case, the rate of temperature rise is adjusted by the conveying speed of the substrate.

The above-mentioned coating film is preferably heated for a set period of time at a constant temperature after heating the coating film under a rising temperature conditions. The temperature used is satisfactory when the solvent inside the film becomes 0.5% by mass or less as the result of the heating; and the temperature may be equal to or less than the glass transition temperature, but is preferably equal to or higher than the glass transition temperature. The specific heating temperature is preferably 250° C. or higher, and more preferably 270° C. or higher. Heating time is typically about 0.5 to 2 hours.

There is no particular limitation with respect to the heating method used for heating the above-mentioned coating film at a constant temperature, and is heated, for example, by an oven adjusted to a constant temperature. In addition, the elongated coating film is heated by a heating furnace or the like of which temperature is kept constant.

Here, a polyimide is easily oxidized when heated at a temperature above 200° C. When the polyimide is oxidized, a polyimide film to be obtained is turned yellow, causing the total light transmittance of the polyimide film to be lowered. Therefore, at a temperature range above 200° C., it is preferable to adjust (i) the heating atmosphere to an inert gas atmosphere, or (ii) the heating atmosphere to a reduced pressure.

(i) When the heating atmosphere is inert gas atmosphere, the oxidation reaction of the polyimide is suppressed. The type of the inert gas is not particularly limited, and the inert gas may be an argon gas, a nitrogen gas, or the like. In particular, the concentration of oxygen at the temperature range above 200° C. is preferably 5% by volume or less, more preferably 3% by volume or less, and even more preferably 1% by volume or less. The concentration of oxygen in the atmosphere is measured by a commercially available oximeter (e.g., zirconia oxygen analyzer).

(ii) Heating under reduced pressure also suppresses the oxidation reaction of the polyimide. When the pressure in the heating atmosphere is reduced, the pressure in the atmosphere is reduced to preferably 15 kPa or less, more preferably 5 kPa or less, and even more preferably 1 kPa or less. When the pressure in the heating atmosphere is reduced, the coating film is heated by a vacuum oven, or the like.

After the imidization (ring closure) of the polyamic acid, the substrate is peeled off, thereby affording a polyimide film. When the polyimide film is peeled off from the substrate, there is a possibility that foreign matters may be adsorbed to the polyimide film due to peeling charge. Accordingly, it is preferable (i) to coat the substrate with an antistatic agent, or (ii) to provide the applicator of the polyamic acid or the peeling device of the polyimide film with a static electricity-removing member (e.g., anti-static bar, anti-static yarn, and ion-blowing static electricity-removing device).

(5) Application of Polyimide Film

As described above, the polyimide film of the present invention has high total light transmittance, small coefficient of linear thermal expansion, and small retardation in the thickness direction. Therefore, the polyimide film of the present invention is suitable particularly for a panel substrate of a display apparatus. Examples of the display apparatus include a touch panel, a liquid crystal display, and an organic EL display.

The touch panel is typically a panel body composed of (i) a transparent substrate having a transparent electrode (detection electrode layer), (ii) an adhesion layer, and (iii) a transparent substrate having a transparent electrode (driving electrode layer). The above-mentioned polyimide film can be applied either to the transparent substrate on the side of the detection electrode layer, or to the transparent substrate on the side of the driving electrode layer.

The liquid crystal cell of the liquid crystal display apparatus is typically a panel body having a laminated structure such that (i) a first transparent plate, (ii) a liquid crystal material interposed between transparent electrodes, and (iii) a second transparent plate are sequentially laminated. The polyimide film is applicable either to the first transparent plate or to the second transparent plate. In addition, the polyimide film is also applicable to a substrate for a color filter in the liquid crystal display apparatus.

The organic EL panel is typically a panel in which a transparent substrate, an anode transparent electrode layer, an organic EL layer, a cathode reflective electrode layer, and a counter substrate are sequentially laminated. The polyimide film is applicable either to the transparent substrate or to the counter substrate.

(6) Dry Film

The dry film of the present invention is a film containing the above-mentioned polyamic acid. The dry film either may be photocurable, or may be thermosetting. In addition, the dry film may be laminated together with a carrier film, and the other surface of the dry film may be protected with a cover film.

The carrier film to be laminated with the dry film is preferably a low moisture permeable film. In addition, when the dry film is photocurable, the carrier film preferably has transmittance to light used for curing the dry film. Examples of such a carrier film include transparent films such as polyethylene terephthalate, polyethylene, and polypropylene. On the other hand, the cover film is not particularly limited insofar as the cover film is a low moisture permeable film.

Here, the dry film may be a film composed only of the polyamic acid, but may include components other than the polyamic acid insofar as they do not impair the effects of the present invention. Other components may be photosensivity-imparting components (such as photopolymerizable compounds, and photopolymerization initiators), inorganic fillers, or the like. The amount of other components based on the total mass of the dry film is preferably 20% by mass or less.

The photopolymerizable compound contained in the dry film may be a compound having a photopolymerizable unsaturated double bond. Examples of the photopolymerizable compound include (meth)acrylates, (meth)acrylic acids, styrene, α-alkylstyrene, and diallylphthalates, with (meth)acrylates being preferred.

Examples of the (meth)acrylates include ethyl(meth)acrylate, butyl(meth)acrylate, 2-hydroxyethyl(meth)acrylate, 2-hydroxypropyl(meth)acrylate, oligoester(meth)monoacrylate, ethylene glycol di(meth)acrylate, polyethylene glycol diacrylate, neopentyl glycol(meth)acrylate, tetramethylolmethane di(meth)acrylate, trimethylolpropane di(meth)acrylate, ditrimethylolpropane tetra(meth)acrylate, pentaerythritol tri(meth)acrylate, dipentaerythritol penta(meth)acrylate, dipentaerythritol hexa(meth)acrylate, 2-hydroxy-1-(meth)acryloxy-3-(meth)acrylate, epoxy acrylate (e.g., bisphenol A type epoxy(meth)acrylate, novolac-type epoxy (meth)acrylate, cresol novolac-type epoxy(meth)acrylate, and carboxyl group-containing cresol novolac-type epoxy (meth)acrylate), and urethane(meth)acrylate.

Examples of the photopolymerization initiator contained in the dry film may include benzophenone, methylbenzophenone, o-benzoyl benzoic acid, benzoylethylether, 2,2-diethoxyacetophenone, and 2,4-diethylthioxanthone; sulfonium salt compounds; and oxime ester compounds. The dry film may further contain a photopolymerization accelerator. Examples of the photopolymerization accelerator include p-dimethylbenzoic acid isoamyl, 4,4-bis(diethylamino)benzophenone, and dimethylethanolamine. The total content of the photopolymerization initiator and the photopolymerization accelerator is preferably about 0.05 to 10% by mass based on the photopolymerizable compound.

Examples of the inorganic filler contained in the dry film include silica, talc, magnesium carbonate, calcium carbonate, natural mica, synthetic mica, aluminum hydroxide, precipitated barium sulfate, precipitated barium carbonate, barium titanate, and barium sulfate. The average particle diameter of the inorganic filler is preferably 10 μm or less, and more preferably 5 μm or less.

The thickness of the dry film is appropriately selected depending on the applications of the dry film. For example, the dry film to be used, for example, for an interlayer insulating layer of a circuit board has a thickness of preferably 1 to 100 μm, and more preferably 5 to 50 μm.

The dry film is obtained by preparing a coating liquid in which the above-mentioned polyamic acid varnish and other components, as necessary, are mixed, applying the coating liquid to a carrier film, and removing a residual solvent.

The application of the coating liquid to the carrier film during the manufacture of the dry film is not particularly limited insofar as it is possible to apply the coating liquid in a constant thickness, and may be similar to the above-mentioned method for applying the polyamic acid varnish during the manufacture of the polyimide film.

The method for removing the residual solvent from the coating film is not particularly limited, either, and may be, for example, a method in which the coating film is heated at 80° C. to 150° C. (prebaking). At that time, it is preferable to adjust the amount of the residual solvent of the dry film to a predetermined level or less. In order to maintain the solubility of the dry film in a developer (e.g., aqueous alkali solution) within a suitable range, the amount of the residual solvent of the dry film is preferably 3 to 20% by mass, and more preferably, the upper limit thereof is 10% by mass or less. When the dry film contains a large amount of the residual solvent, the dry film tends to exhibit a high dissolution rate in the developer.

The amount of the residual solvent of the dry film is specified, for example, by gas chromatography (GC) measurement. For example, it is determined by calculating a peak area corresponding to the solvent from a chart obtained by the GC measurement of the dry film, and collating the calculated peak area with a calibration curve prepared separately.

A GC measurement apparatus may be, for example, an electric furnace type pyrolyzer (e.g., PYR-2A manufactured by Shimadzu Corporation) connected to a gas chromatography mass spectrometer (e.g., GC-8A (column Uniport HP 80/100 KG-02) manufactured by Shimadzu Corporation). The measurement method may be, for example, a method in which the dry film is charged into the electric furnace type pyrolyzer, immediately heating the pyrolyzer to 320° C. to thereby generate volatile components, and assaying the volatile components with the gas chromatography mass spectrometer in which the injector temperature and the detector temperature are set at 200° C. and the column temperature is set at 170° C.

2. Display Apparatus

Figure 1B:
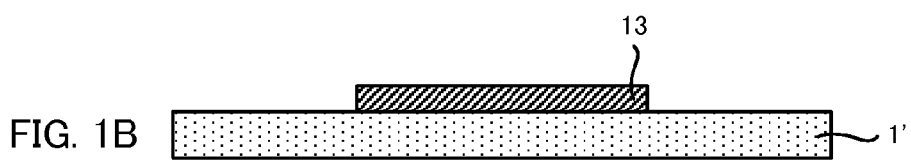

The above-mentioned various display apparatuses can be manufactured by forming a device on the above-mentioned polyimide film. When manufacturing the display apparatus, firstly, polyimide laminate 12 in which polyimide layer 1' is laminated on substrate 11 is prepared, as illustrated in FIG. 1A. The method of manufacturing the polyimide laminate 12 may be similar to the above-mentioned method of manufacturing the polyimide film. Then, polyimide layer 1' is peeled off from polyimide laminate 12 (FIG. 1A); and device 13 is formed on polyimide layer 1' (FIG. 1B). In this case, the device to be formed on polyimide layer 1' may be the electrode layer of the touch panel, the color filter of the liquid crystal display apparatus, the electrode layer or organic EL layer of the organic EL panel, or the like.

Figure 2A:
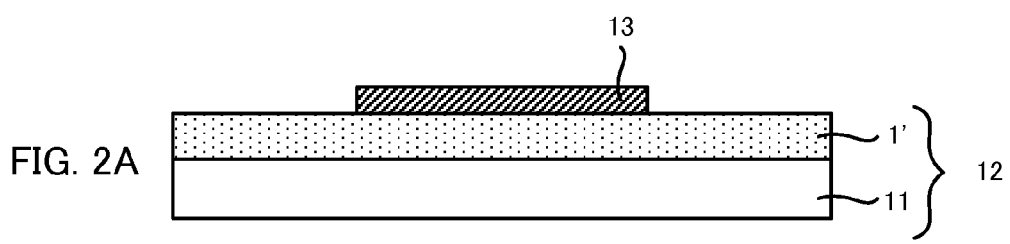
FIGS. 2A, 2B and 2C are schematic sectional views illustrating another example of a method of manufacturing a display apparatus using a polyimide laminate of the present invention.
Figure 2B:
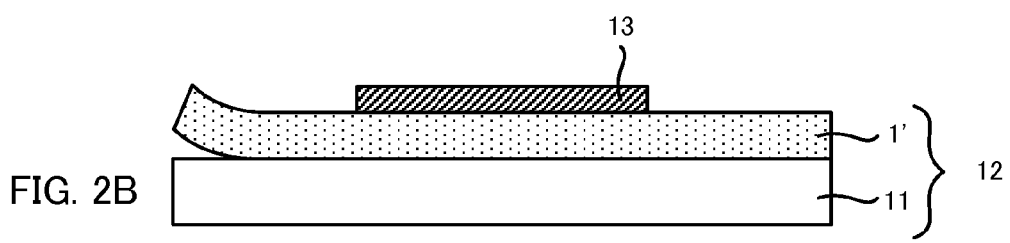
Figure 2C:
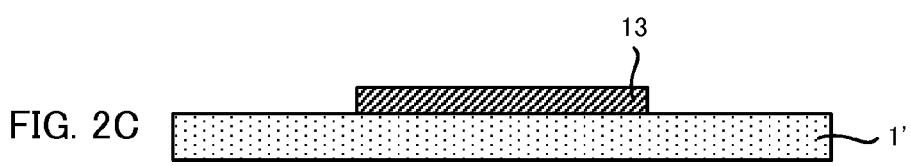

As another example of the method of manufacturing the display apparatus, there can be mentioned a method comprising preparing polyimide laminate 12 in which polyimide layer 1' is laminated on substrate 11, and forming device 13 is on the polyimide layer 1' (FIG. 2A). In this method, polyimide layer 1' is peeled off from substrate 11 after the formation of device 13 (FIG. 2B), thereby obtaining a display apparatus having device 13 formed thereon (FIG. 2C). In this method, stress applied to polyimide layer 1' during the formation of device 13 tends to be absorbed by substrate 11. Accordingly, polyimide layer 1' is less likely to be torn or cracked during the formation of device 13.

EXAMPLES

Hereinafter, the present invention is further described in detail with reference to Examples. However, the technical scope of the present invention is not construed to be limited by these Examples. The respective polyimide films produced in the Examples and Comparative Examples were measured for retardation in the thickness direction (Rth) per thickness of 10 μm, coefficient of linear thermal expansion (CTE), glass transition temperature (Tg), total light transmittance, and b*value, according to the following methods.

1) Calculation of Retardation in Thickness Direction (Rth) Per 10 μm

The polyimide films produced in the Examples and Comparative Examples were measured for refractive index in the x-axis direction (nx), refractive index in the y-axis direction (ny) and refractive index in the z-axis direction (nz) using light with a wavelength of 550 nm at room temperature (20° C. to 25° C.) using an optical material inspection apparatus (model: RETS-100) manufactured by Otsuka Electronics Co., Ltd. The retardation in the thickness direction (Rth) was calculated from the refractive index in the x-axis direction (nx), the refractive index in the y-axis direction (ny) and the refractive index in the z-axis direction (nz), and the thickness (d) of the film, according to the following equation:

$$Rth \text{ (nm)} = [nz - (nx + ny)/2] \times d.$$

The obtained value was converted into a value per thickness (d) of 10 μm.

2) Measurement of Coefficient of Linear Thermal Expansion (CTE) and Glass Transition Temperature (Tg)

The polyimide films produced in the Examples and Comparative Examples were cut to have a width of 4 mm and a length of 20 mm. The samples were measured for coefficient of linear thermal expansion (CTE) and glass transition temperature (Tg) using a thermal analyzer (TMA-50) manufactured by Shimadzu Corporation.

3) Measurement of Total Light Transmittance of Film

The polyimide films produced in Examples and Comparative Examples were measured for total light transmittance with the D65 light source in accordance with JIS-K-7105 using a haze meter (NDH2000) manufactured by Nippon Denshoku Industries Co., Ltd.

4) Measurement of b*Value

The polyimide films produced in the Examples and Comparative Examples were measured for b*value, an index of yellowness of the polyimide film, using a chroma meter (measuring head: CR-300 manufactured by Konica Minolta, Inc.) and a data processor (DP-300 manufactured by Konica Minolta, Inc.). The measurement was repeated three times, and an average value of the measurements was employed.

The abbreviations of compounds used in the Examples and Comparative Examples are as follows:

[Tetracarboxylic Dianhydride Component]
BPDA: 3,3',4,4'-biphenyltetracarboxylic dianhydride
BPAF: fluorenylidene bis(phthalic anhydride) (component (ii))
NDCA: naphthalene 2,3,6,7-tetracarboxylic dianhydride
ODPA: bis(3,4-dicarboxyphenyl)ether dianhydride

[Diamine Component]
1,4-BAC: 1,4-bis(aminomethyl)cyclohexane (component (iii))
1,5-DAN: 1,5-diaminonaphthalene (component (i))
3,3'-DAS: 3,3'-diaminodiphenylsulfone
4,4'-DAS: 4,4'-diaminodiphenylsulfone
1,4-CHDA: trans-1,4-cyclohexanediamine
NBDA: an isomeric mixture of 2,5-bis(aminomethyl)norbornane and 2,6-bis(aminomethyl)norbornane Synthesis Example 1

11.38 g (0.08 mol) of 1,4-BAC, 3.16 g (0.02 mol) of 1,5-DAN, and 175.8 g (corresponding to a concentration of 20% by mass) of N,N-dimethylacetamide (DMAc) were added into a flask equipped with a thermometer, a condenser, a nitrogen inlet and a stirring blade, and stirred under a nitrogen atmosphere to give a homogenous solution. It is noted that the cis/trans ratio of 1,4-BAC was 15/85. 29.42 g (0.1 mol) of BPDA was charged in a form of powder into this solution and stirred while raising the temperature, whereupon sudden heat generation and production of white salt were confirmed around 55° C. Thereafter, immediate conversion to a homogenous solution was observed. At the time when the temperature inside the flask rose to 84° C. due to heat generation, the solution was immediately cooled to 70° C. Subsequently, the solution was allowed to react at 70° C. to 75° C. for 1 hour. Thereafter, the solution was cooled to room temperature, and aged at room temperature overnight to give a yellow to pale brown viscous varnish. The inherent logarithmic viscosity ηinh (measured with Ubbelohde viscometer at a polymer concentration of 0.5 g/dL, DMAc, and at 35° C.) of the obtained polyamic acid varnish was 0.93, and the viscosity at 25° C. with E-type viscometer was 23,000 mPa·s.

Synthesis Example 2

11.38 g (0.08 mol) of 1,4-BAC, 3.16 g (0.02 mol) of 1,5-DAN, and 182.4 g (corresponding to a concentration of 20% by mass) of N,N-dimethylacetamide (DMAc) were added into a reactor similar to that of Synthesis Example 1, and stirred under a nitrogen atmosphere to give a homogenous solution. It is noted that the cis/trans ratio of 1,4-BAC was 15/85. 26.48 g (0.09 mol) of BPDA and 4.58 g (0.01 mol) of BPAF were charged successively in a form of powder into this solution, and the solution was stirred and allowed to react. After the addition of BPAF, gradual heat generation was observed, and the temperature inside the flask rose to 54° C. When the temperature rise due to heat generation was no longer observed, the solution was subsequently heated for the reaction to proceed at 70° C. to 75° C. for 1 hour. Thereafter, the solution was cooled to room temperature, and aged at room temperature overnight to give a yellow to pale brown viscous varnish. The inherent logarithmic viscosity ηinh of the obtained polyamic acid varnish was 1.1, and the viscosity at 25° C. with E-type viscometer was 73,000 mPa·s.

Synthesis Example 3

8.53 g (0.06 mol) of 1,4-BAC, 3.16 g (0.02 mol) of 1,5-DAN, 4.98 g (0.02 mol) of 3,3'-DAS, and 197.5 g (corresponding to a concentration of 20% by mass) of N,N-dimethylacetamide (DMAc) were added into a reactor similar to that of Synthesis Example 1, and stirred under a nitrogen atmosphere to give a homogenous solution. It is noted that the cis/trans ratio of 1,4-BAC was 15/85. 23.54 g (0.08 mol) of BPDA and 9.17 g (0.02 mol) of BPAF were charged successively in a form of powder into this solution. The solution was stirred and allowed to react. After the addition of BPAF, gradual heat generation was observed, and the temperature inside the flask rose to 57° C. When the temperature rise due to heat generation was no longer observed, the solution was subsequently heated for the reaction to proceed at 70° C. to 75° C. for 1 hour. Thereafter, the solution was cooled to room temperature, and aged at room temperature overnight to give a yellow to pale brown viscous varnish. The inherent logarithmic viscosity ηinh of the obtained polyamic acid varnish was 0.75, and the viscosity at 25° C. with E-type viscometer was 4,730 mPa·s.

Synthesis Example 4

8.53 g (0.06 mol) of 1,4-BAC, 3.16 g (0.02 mol) of 1,5-DAN, 4.98 g (0.02 mol) of 4,4'-DAS, and 197.5 g (corresponding to a concentration of 20% by mass) of N,N-dimethylacetamide (DMAc) were added into a reactor similar to that of Synthesis Example 1, and stirred under a nitrogen atmosphere to give a homogenous solution. It is noted that the cis/trans ratio of 1,4-BAC was 15/85. 23.54 g (0.08 mol) of BPDA and 9.17 g (0.02 mol) of BPAF were charged in a form of powder into this solution, and the solution was stirred and allowed to react. After the addition of BPAF, gradual heat generation was observed, and the temperature inside the flask rose to 52° C. When the temperature rise due to heat generation was no longer observed, the solution was subsequently heated for the reaction to proceed at 70° C. to 75° C. for 1 hour. Thereafter, the solution was cooled to room temperature, and aged at room temperature overnight to give a yellow to pale brown viscous varnish. The inherent logarithmic viscosity ηinh of the obtained polyamic acid varnish was 0.35, and the viscosity at 25° C. with E-type viscometer was 298 mPa·s.

Synthesis Example 5

8.53 g (0.06 mol) of 1,4-BAC, 1.58 g (0.01 mol) of 1,5-DAN, 7.45 g (0.03 mol) of 4,4'-DAS, and 201.1 g (corresponding to a concentration of 20% by mass) of N,N-dimethylacetamide (DMAc) were added into a reactor similar to that of Synthesis Example 1, and stirred under a nitrogen atmosphere to give a homogenous solution. It is noted that the cis/trans ratio of 1,4-BAC was 15/85. 23.54 g (0.08 mol) of BPDA and 9.17 g (0.02 mol) of BPAF were charged successively in a form of powder into this solution and stirred. After the addition of BPAF, gradual heat generation was observed, and the temperature inside the flask rose to 53° C. When the temperature rise due to heat generation was no longer observed, the solution was subsequently heated for the reaction to proceed at 70° C. to 75° C. for 1 hour. Thereafter, the solution was cooled to room temperature, and aged at room temperature overnight to give a yellow to pale brown viscous varnish. The inherent logarithmic viscosity ηinh of the obtained polyamic acid varnish was 0.29, and the viscosity at 25° C. with E-type viscometer was 251 mPa·s.

Synthesis Example 6

8.53 g (0.06 mol) of 1,4-BAC, 3.16 g (0.02 mol) of 1,5-DAN, 2.28 g (0.02 mol) of 1,4-CHDA, and 186.8 g (corresponding to a concentration of 20% by mass) of N,N-dimethylacetamide (DMAc) were added into a reactor similar to that of Synthesis Example 1, and stirred under a nitrogen atmosphere to give a homogenous solution. It is noted that the cis/trans ratio of 1,4-BAC was 15/85. 23.54 g (0.08 mol) of BPDA and 9.17 g (0.02 mol) of BPAF were charged successively in a form of powder into this solution and stirred. After the addition of BPAF, gradual heat generation was observed, and the temperature inside the flask rose to 57° C. When the temperature rise due to heat generation was no longer observed, the solution was subsequently heated for the reaction to proceed at 70° C. to 75° C. for 1 hour. Thereafter, the solution was cooled to room temperature, and aged at room temperature overnight to give a yellow to pale brown viscous varnish. The inherent logarithmic viscosity ηinh of the obtained polyamic acid varnish was 1.1, and the viscosity at 25° C. with E-type viscometer was 155,000 mPa·s.

Synthesis Example 7

8.53 g (0.06 mol) of 1,4-BAC, 1.58 g (0.01 mol) of 1,5-DAN, 3.43 g (0.03 mol) of 1,4-CHDA, and 185.0 g (corresponding to a concentration of 20% by mass) of N,N-dimethylacetamide (DMAc) were added into a reactor similar to that of Synthesis Example 1, and stirred under a nitrogen atmosphere to give a homogenous solution. It is noted that the cis/trans ratio of 1,4-BAC was 15/85. 23.54 g (0.08 mol) of BPDA and 9.17 g (0.02 mol) of BPAF were charged successively in a form of powder into this solution and stirred. After the addition of BPAF, gradual heat generation from the reaction was observed, and the temperature inside the flask rose up to a maximum of 57° C. When the temperature rise due to heat generation was no longer observed, the solution was subsequently heated for the reaction to proceed at 70° C. to 75° C. for 1 hour. Thereafter, the solution was cooled to room temperature, and aged at room temperature overnight to give a yellow to pale brown viscous varnish. The inherent logarithmic viscosity ηinh of the obtained polyamic acid varnish was 1.0, and the viscosity at 25° C. with E-type viscometer was 119,000 mPa·s.

Synthesis Example 8

14.22 g (0.1 mol) of 1,4-BAC and 172.5 g (corresponding to a concentration of 20% by mass) of N,N-dimethylacetamide (DMAc) were added into a reactor similar to that of Synthesis Example 1, and stirred under a nitrogen atmosphere to give a homogenous solution. It is noted that the cis/trans ratio of 1,4-BAC was 15/85. 23.54 g (0.08 mol) of BPDA and 5.36 g (0.02 mol) of NDCA were charged successively in a form of powder into this solution and stirred while raising the temperature, whereupon sudden heat generation and production of white salt were confirmed around 55° C. Thereafter, immediate conversion to a homogenous solution was observed. At the time when the temperature inside the flask rose to 88° C. due to heat generation, the solution was immediately cooled to 70° C., and subsequently the solution was allowed to react at 70° C. to 75° C. for 1 hour. Thereafter, the solution was cooled to room temperature, and aged at room temperature overnight to give a yellow to pale brown viscous varnish. The logarithmic viscosity ηinh of the obtained polyamic acid varnish was 0.85, and the viscosity at 25° C. with E-type viscometer was 34,000 mPa·s.

Synthesis Example 9

(1) 11.43 g (0.0741 mol) of NBDA, 29.4 g (0.10 mol) of BPDA, 122.5 g (corresponding to a concentration of 25% by mass) of N,N-dimethyl-2-imidazolidinone (DMI), and 20 g of xylene as a reflux dehydrating agent were added into a flask equipped with a thermometer, a condenser, a Dean-Stark water separator, a nitrogen inlet and a stirring blade, and stirred under a nitrogen atmosphere, while raising the temperature to 70° C. Sudden heat generation and production of white salt were confirmed around 50° C. Thereafter, immediate conversion to a homogenous solution was confirmed, and the temperature rose even further. When the internal temperature reached around 170° C., xylene started refluxing. Then, the reaction was continued for 6 hours at a temperature within a range of 175° C. to 190° C. During the reaction, condensed water distilled off together with xylene was removed out of the system, and xylene was returned into the system. When substantially no water distillation was observed, distilled xylene was also removed out of the system. After completion of the reaction, the solution was cooled to give a pale yellow solution of imide oligomer in DMI. The concentration of the obtained imide oligomer in the solution was 25.1% by mass.

(2) 6.33 g (0.04 mol) of 1,5-DAN and 99.1 g (corresponding to a concentration of 15% by mass) of N,N-dimethylacetamide (DMAc) were added into a reactor similar to that of Synthesis Example 1, and stirred under a nitrogen atmosphere to give a homogenous solution. 11.17 g (0.36 mol) of ODPA was charged in a form of powder into this solution, and the solution was allowed to react at room temperature while stirring. While neither sudden heat generation nor precipitation was found, the viscosity increased gradually. Thereafter, the solution was aged at room temperature overnight while stirring to give a yellow to pale brown viscous varnish containing an amic acid oligomer.

(3) 15.28 g of a DMI solution of the imide oligomer obtained in (1) and 70 g of the varnish containing the amic acid oligomer obtained in (2) were charged into a reactor similar to that of Synthesis Example 1, thereby charging equimolar amounts of the imide oligomer and the amic acid oligomer in terms of their terminal functional groups, and stirred at room temperature under a nitrogen atmosphere. With the progress of the reaction, an increase in viscosity was observed. Thereafter, the solution was aged at room temperature overnight while stirring to give a yellow to pale brown viscous varnish. The logarithmic viscosity ηinh of the obtained polyimide/polyamic acid block copolymer varnish was 0.97, and the viscosity at 25° C. with E-type viscometer was 114,000 mPa·s.

Synthesis Example 10

7.11 g (0.05 mol) of 1,4-BAC, 5.71 g (0.05 mol) of 1,4-CHDA, and 175.5 g (corresponding to a concentration of 20% by mass) of N,N-dimethylacetamide (DMAc) were added into a reactor similar to that of Synthesis Example 1, and stirred under a nitrogen atmosphere to give a homogenous solution. It is noted that the cis/trans ratio of 1,4-BAC was 15/85. 26.48 g (0.09 mol) of BPDA and 4.58 g (0.01 mol) of BPAF were charged successively into this solution and stirred. After the addition of BPAF, gradual heat generation was observed, and the temperature inside the flask rose to 50° C. When the temperature rise due to heat generation was no longer observed, the temperature was raised while stirring, whereupon sudden heat generation and production of white salt were confirmed around 55° C. Thereafter, immediate conversion to a homogenous solution was observed. At the time when the temperature inside the flask rose to 81° C. due to heat generation, the solution was immediately cooled to 70° C., and subsequently allowed to react at 70° C. to 75° C. for 1 hour. Thereafter, the solution was cooled to room temperature, and aged at room temperature overnight to give a yellow to pale brown viscous varnish. The logarithmic viscosity ηinh of the obtained polyamic acid varnish was 0.95, and the viscosity at 25° C. with E-type viscometer was 71,000 mPa·s.

Synthesis Example 11

14.22 g (0.1 mol) of 1,4-BAC and 174.6 g (corresponding to a concentration of 20% by mass) of N,N-dimethylacetamide (DMAc) were added into a reactor similar to that of Synthesis Example 1, and stirred under a nitrogen atmosphere to give a homogenous solution. It is noted that the cis/trans ratio of 1,4-BAC was 15/85. 29.42 g (0.1 mol) of BPDA was charged in a form of powder into this solution and the temperature was raised while stirring, whereupon sudden heat generation and production of white salt were confirmed around 55° C. Thereafter, immediate conversion to a homogenous solution was observed. At the time when the temperature inside the flask rose to 88° C. due to heat generation, the solution was immediately cooled to 70° C., and subsequently allowed to react at 70° C. to 75° C. for 1 hour. Thereafter, the solution was cooled to room temperature, and aged at room temperature overnight to give a yellow to pale brown viscous varnish. The logarithmic viscosity ηinh of the obtained polyamic acid varnish was 1.00, and the viscosity at 25° C. with E-type viscometer was 62,000 mPa·s.

Synthesis Example 12

11.42 g (0.1 mol) of 1,4-CHDA and 272.3 g (corresponding to a concentration of 15% by mass) of N,N-dimethylacetamide (DMAc) were added into a reactor similar to that of Synthesis Example 1, and stirred under a nitrogen atmosphere to give a homogenous solution. 29.42 g (0.1 mol) of BPDA was charged in a form of powder into this solution and the temperature was raised while stirring, whereupon sudden heat generation and production of white salt were confirmed around 55° C. Thereafter, immediate conversion to a homogenous solution was observed. At the time when the temperature inside the flask rose to 91° C. due to heat generation, the solution was immediately cooled to 70° C., and subsequently allowed to react at 70° C. to 75° C. for 1 hour. Thereafter, the solution was cooled to room temperature, and aged at room temperature overnight to give a yellow to pale brown viscous varnish. The logarithmic viscosity ηinh of the obtained polyamic acid varnish was 1.4, and the viscosity at 25° C. with E-type viscometer was 167,000 mPa·s.

Example 1

The polyamic acid varnish prepared in Synthesis Example 1 was applied onto a glass substrate with a doctor blade to form a coating film of the polyamic acid varnish. A laminate composed of the substrate and the coating film of the polyamic acid varnish was placed in an inert oven. Thereafter, the concentration of oxygen inside the inert oven was controlled to be 0.1% by volume or less, and the temperature of the atmosphere inside the oven was raised from 50° C. to 270° C. over 120 minutes (temperature-raising rate: about 1.8° C./min.), followed by keeping the temperature at 270° C. for 2 hours. After completion of the heating, the sample which had been naturally cooled inside the inert oven was immersed in distilled water to peel off the polyimide film from the substrate. The thickness and various physical properties of the obtained polyimide film are shown in Table 1.

Examples 2 to 6, 8, 9 and Comparative Examples 1 to 3

Polyimide films were produced in substantially the same manner as Example 1 except that the polyamic acid varnish was changed to the respective polyamic acid varnishes shown in Table 1.

Example 7

The polyamic acid varnish prepared in Synthesis Example 7 was applied onto a glass substrate with a doctor blade to form a coating film of the polyamic acid varnish. A laminate composed of the substrate and the coating film of the polyamic acid varnish was placed in an oven. Thereafter, while removing the air inside the oven from an exhaust using a draft fan, the temperature of the atmosphere inside the oven was raised from 30° C. to 180° C. over 80 minutes (temperature-raising rate: about 1.9° C./min.), and was further kept at 180° C. for 15 hours, thereby obtaining a laminate without tackiness. After naturally cooling the laminate, the laminate was placed in a vacuum oven, followed by further heating while reducing the pressure to 0.5 kPa or less, and raising the temperature from 50° C. to 270° C. over 120 minutes (temperature-raising rate: about 1.8° C./min.), followed by keeping the temperature at 270° C. for 1 hour. After completion of the heating, the sample which had been naturally cooled under reduced pressure was further immersed in distilled water to peel off the polyimide film from the substrate.

TABLE 1

| | | | Polyamic Acid Varnish | | | | |
|---|---|---|---|---|---|---|---|
| | | | Tetracarboxylic Dianhydride | | Drying Condition | | |
| | Substrate | Synthesis Ex. | Component (Content Weight Ratio) | Diamine Component (Content Weight Ratio) | Oxygen Concentration (% by volume) | Pressure (MPa) | Drying Condition |
| Ex. 1 | Glass | 1 | BPDA(100) | 1,4-BAC/1,5-DAN (80/20) | ≤0.1 | 0.1 | *1 |
| Ex. 2 | ↑ | 2 | BPDA/BPAF (90/10) | 1,4-BAC/1,5-DAN (80/20) | ↑ | ↑ | ↑ |
| Ex. 3 | ↑ | 3 | BPDA/BPAF (80/20) | 1,4-BAC/1,5-DAN/3,3'-DAS (60/20/20) | ↑ | ↑ | ↑ |
| Ex. 4 | ↑ | 4 | BPDA/BPAF (80/20) | 1,4-BAC/1,5-DAN/4,4'-DAS (60/20/20) | ↑ | ↑ | ↑ |
| Ex. 5 | ↑ | 5 | BPDA/BPAF (80/20) | 1,4-BAC/1,5-DAN/4,4'-DAS (60/10/30) | ↑ | ↑ | ↑ |
| Ex. 6 | ↑ | 6 | BPDA/BPAF (80/20) | 1,4-BAC/1,5-DAN/1,4-CHDA (60/20/20) | ↑ | ↑ | ↑ |
| Ex. 7 | ↑ | 7 | BPDA/BPAF (80/20) | 1,4-BAC/1,5-DAN/1,4-CHDA (60/10/30) | *2 | *2 | *2 |
| Ex. 8 | ↑ | 8 | BPDA/NDCA (80/20) | 1,4-BAC(100) | ≤0.1 | 0.1 | *1 |
| Ex. 9 | ↑ | 9 | BPDA/ODPA (30.2/69.8) | NBDA/1,5-DAN (22.2/77.8) | ↑ | ↑ | ↑ |
| Comp. Ex. 1 | ↑ | 10 | BPDA/BPAF (90/10) | 1,4-BAC/1,4-CHDA (50/50) | ↑ | ↑ | ↑ |
| Comp. Ex. 2 | ↑ | 11 | BPDA(100) | 1,4-BAC(100) | ↑ | ↑ | ↑ |
| Comp. Ex. 3 | ↑ | 12 | BPDA(100) | 1,4-CHDA(100) | ↑ | ↑ | ↑ |

| | Evaluation | | | | | |
|---|---|---|---|---|---|---|
| | Thickness (μm) | Retardation in Thickness Direction per 10 μm (nm) | Tg (° C.) | Coefficient of Linear Thermal Expansion (ppm/K) | Total Light Transmittance (%) | b* Value |
| Ex. 1 | 20 | 180.1 | 296.0 | 30.1 | 88 | 5.7 |
| Ex. 2 | 19 | 116 | 307.0 | 28.0 | 88 | 5.2 |
| Ex. 3 | 25 | 82.1 | 318.9 | 30.0 | 88 | 6.0 |
| Ex. 4 | 26 | 100.7 | 330.3 | 28.6 | 88 | 7.4 |
| Ex. 5 | 27 | 90.9 | 326.1 | 33.2 | 88 | 5.2 |
| Ex. 6 | 27 | 127.4 | 326.6 | 27.1 | 88 | 6.5 |
| Ex. 7 | 24 | 118.7 | 319.1 | 30.2 | 88 | 4.5 |
| Ex. 8 | 22 | 161.2 | 270.8 | 31.0 | 88 | 3.7 |
| Ex. 9 | 21 | 157.1 | 301.5 | 15.5 | 87 | 7.6 |
| Comp. Ex. 1 | 17 | 228 | 310 | 31.6 | 88 | 2.6 |
| Comp. Ex. 2 | 20 | 50 | 160 | 45.6 | 90 | 2.1 |
| Comp. Ex. 3 | 20 | 1500 | ≥300 | 6.2 | 89 | 2.3 |

Drying Condition*1: In an inert oven, the temperature is raised from 50° C. to 270° C. over 120 minutes (temperature-raising rate: about 1.8° C./min.), and is further kept at 270° C. for 2 hours.
Drying Condition*2: (1) In a fan oven, the temperature is raised from 30° C. to 180° C. over 80 minutes (temperature-raising rate: about 1.9° C./min.), and is further kept at 180° C. for 15 hours. (2) In a vacuum oven, the pressure in the atmosphere is reduced to 0.5 kPa or less, and the temperature is raised from 50° C. to 270° C. over 120 minutes (temperature-raising rate: about 1.8° C./min.), and is further kept at 270° C. for 1 hour under this atmosphere.

As shown in Table 1, in Examples 1 to 9 in which 1,5-diamino naphthalene (component (i)), or naphthalene 2,3,6,7-tetracarboxylic dianhydride (component (i)) is used as a polymerization component for a polyimide, all of the obtained polyimide films have a coefficient of linear thermal expansion of 35 ppm/K or less, and have a retardation in the thickness direction of 200 nm or less.

In contrast, in Comparative Examples 1 to 3 in which the component (i) is not used as the polymerization component for the polyimide, it was difficult to simultaneously reduce the retardation in the thickness direction per polyimide film thickness of 10 μm and the coefficient of linear thermal expansion.

In addition, comparisons between Examples 4 and 5 and between Examples 6 and 7 reveal that a polyimide film containing a larger amount of 1,5-diamino naphthalene (component (i)) had a lower coefficient of linear thermal expansion.

INDUSTRIAL APPLICABILITY

The polyimide film of the present invention has small retardation in the thickness direction, small coefficient of linear thermal expansion, and high transmittance of visible light. Accordingly, the polyimide film of the present invention is applicable to a panel substrate for various display apparatuses.

REFERENCE SIGNS LIST

1' Polyimide layer
11 Substrate
12 Polyimide laminate
13 Device

The invention claimed is:
1. A polyimide film made of a polyimide obtained by reacting a diamine component with a tetracarboxylic dianhydride component, wherein a coefficient of linear thermal expansion is 35 ppm/K or less throughout the range from 100° C. to 200° C.,
an absolute value of retardation in a thickness direction is 200 nm or less per thickness of 10 μm,
a glass transition temperature is 260° C. or higher, and
a total light transmittance is 85% or more;
wherein the diamine component includes 5 to 80 mol % based on the total amount of the diamine component of 1,5-diamino naphthalene represented by chemical formula (1), and
the tetracarboxylic dianhydride component includes 0 to 95 mol % based on the total amount of the tetracarboxylic dianhydride component of naphthalene 2,3,6,7-tetracarboxylic dianhydride represented by chemical formula (2A) and/or naphthalene 1,2,5,6-tetracarboxylic dianhydride represented by chemical formula (2B)

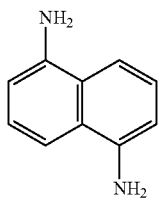

(1)

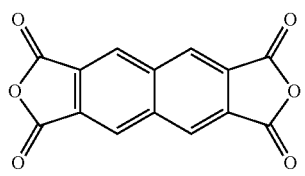

(2A)

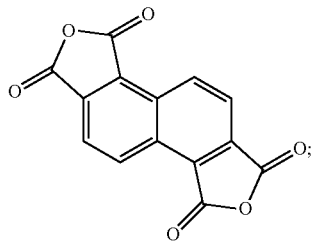

(2B)

and
wherein the tetracarboxylic dianhydride component includes 5 to 50 mol % based on the total amount of the tetracarboxylic dianhydride component of fluorenylidene bis(phthalic anhydride) represented by chemical formula (4)

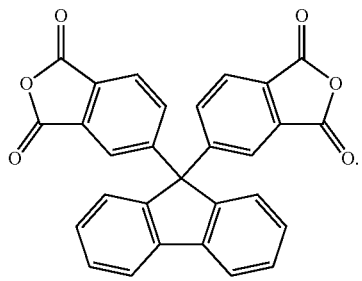

(4)

2. The polyimide film according to claim 1,
wherein the diamine component includes 0 to 50 mol % based on the total amount of the diamine component of 9,9-bis(4-aminophenyl)fluorene represented by chemical formula (3)

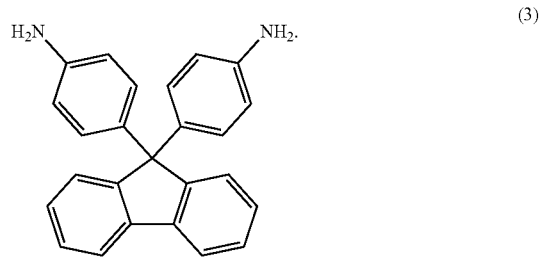 [SMILES: Nc1ccc(C2(c3ccc(N)cc3)c3ccccc3-c3ccccc32)cc1]

(3)

3. The polyimide film according to claim 1, wherein the diamine component includes one or more compounds selected from the group consisting of 1,4-bis(aminomethyl)cyclohexane, bis(aminomethyl)norbornane, isophoronediamine, trans-1,4-diaminocyclohexane, and a hydrogenated product of 4,4'-diaminodiphenylmethane.

4. A polyamic acid obtained by reacting a diamine component with a tetracarboxylic dianhydride component,
wherein a coefficient of linear thermal expansion of a polyimide film obtained by imidizing the polyamic acid is 35 ppm/K or less throughout the range from 100° C. to 200° C.,
an absolute value of retardation in a thickness direction of the polyimide film is 200 nm or less per thickness of 10 μm,
a glass transition temperature of the polyimide film is 260° C. or higher, and
a total light transmittance is 85% or more;
wherein the diamine component includes 5 to 80 mol % based on the total amount of the diamine component of 1,5-diamino naphthalene represented by chemical formula (1), and
the tetracarboxylic dianhydride component includes 0 to 95 mol % based on the total amount of the tetracarboxylic dianhydride component of naphthalene 2,3,6,7-tetracarboxylic dianhydride represented by chemical formula (2A) and/or naphthalene 1,2,5,6-tetracarboxylic dianhydride represented by chemical formula (2B)

(1)

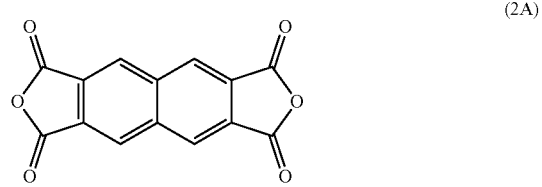

(2A)

-continued (2B)

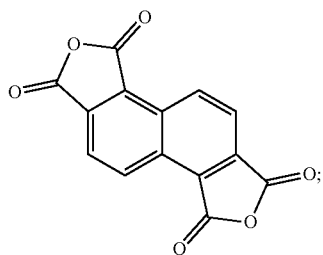

and
wherein the tetracarboxylic dianhydride component includes 5 to 50 mol % based on the total amount of the tetracarboxylic dianhydride component of fluorenylidene bis(phthalic anhydride) represented by chemical formula (4)

(4)

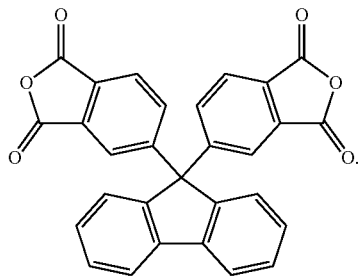

5. The polyamic acid according to claim 4,
wherein the diamine component includes 0 to 50 mol % based on the total amount of the diamine component of 9,9-bis(4-aminophenyl)fluorene represented by chemical formula (3)

(3)

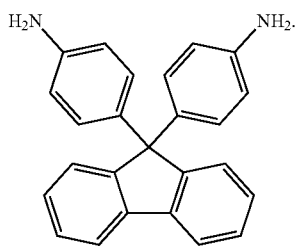

6. The polyamic acid according to claim 4, wherein the diamine component includes one or more compounds selected from the group consisting of 1,4-bis(aminomethyl)cyclohexane, bis(aminomethyl)norbornane, isophoronediamine, trans-1,4-diaminocyclohexane, and a hydrogenated product of 4,4'-diaminodiphenylmethane.

7. A polyamic acid varnish comprising the polyamic acid according to claim 4.

8. A dry film comprising the polyamic acid according to claim 4.

9. A polyimide obtained by curing the polyamic acid according to claim 4.

10. A method of manufacturing a polyimide laminate in which a substrate and a polyimide layer are laminated, the method comprising:

coating a substrate with the polyamic acid varnish according to claim 7; and
heating a film of the coated polyamic acid varnish in an inert gas atmosphere.

11. A method of manufacturing a polyimide laminate in which a substrate and a polyimide layer are laminated, the method comprising:

coating a substrate with the polyamic acid varnish according to claim 7; and
heating a film of the coated polyamic acid varnish under an atmosphere of 15 kPa or less.

12. A polyimide film obtained by peeling off the substrate from the polyimide laminate obtained by the manufacturing method of claim 10.

13. A method of manufacturing a display apparatus, comprising:

peeling off the substrate from the polyimide laminate obtained by the manufacturing method of claim 10, thereby obtaining a polyimide film; and
forming a device on the polyimide film.

14. A method of manufacturing a display apparatus, comprising:

forming a device on the polyimide layer of the polyimide laminate obtained by the manufacturing method of claim 10; and
peeling off the polyimide layer on which the device is formed from the substrate.

15. A touch panel display obtained by the method of manufacturing the display apparatus according to claim 13.

16. A liquid crystal display obtained by the method of manufacturing the display apparatus according to claim 13.

17. An organic EL display obtained by the method of manufacturing the display apparatus according to claim 13.

18. A touch panel display obtained by the method of manufacturing the display apparatus according to claim 14.

19. A liquid crystal display obtained by the method of manufacturing the display apparatus according to claim 14.

20. An organic EL display obtained by the method of manufacturing the display apparatus according to claim 14.

21. A polyimide film obtained by peeling off the substrate from the polyimide laminate obtained by the manufacturing method of claim 11.

22. A method of manufacturing a display apparatus, comprising:

peeling off the substrate from the polyimide laminate obtained by the manufacturing method of claim 11, thereby obtaining a polyimide film; and
forming a device on the polyimide film.

23. A method of manufacturing a display apparatus, comprising:

forming a device on the polyimide layer of the polyimide laminate obtained by the manufacturing method of claim 11; and
peeling off the polyimide layer on which the device is formed from the substrate.

24. A touch panel display obtained by the method of manufacturing the display apparatus according to claim 22.

25. A liquid crystal display obtained by the method of manufacturing the display apparatus according to claim 22.

26. An organic EL display obtained by the method of manufacturing the display apparatus according to claim 22.

27. A touch panel display obtained by the method of manufacturing the display apparatus according to claim 23.

28. A liquid crystal display obtained by the method of manufacturing the display apparatus according to claim 23.

29. An organic EL display obtained by the method of manufacturing the display apparatus according to claim 23.

30. A touch panel display comprising the polyimide film according to claim 1.

31. A liquid crystal display comprising the polyimide film according to claim 1.

32. An organic EL display comprising the polyimide film according to claim 1.

* * * * *